US012635127B2

(12) United States Patent　　(10) Patent No.:　US 12,635,127 B2
Li et al.　　(45) Date of Patent:　May 19, 2026

(54) SEMICONDUCTOR MEMORY DEVICE AND METHOD FOR FORMING THE SAME

(71) Applicant: Fujian Jinhua Integrated Circuit Co., Ltd., Quanzhou City (CN)

(72) Inventors: Yu-Hsien Li, Quanzhou City (CN); Xiaobing Chen, Quanzhou City (CN); Daochu Wu, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 367 days.

(21) Appl. No.: 18/203,048

(22) Filed: May 29, 2023

(65) Prior Publication Data

US 2024/0244821 A1　　Jul. 18, 2024

(30) Foreign Application Priority Data

Jan. 18, 2023　(CN) .......................... 202310073123.7
Jan. 18, 2023　(CN) .......................... 202320148690.X

(51) Int. Cl.
H10B 12/00　　(2023.01)
(52) U.S. Cl.
CPC ......... H10B 12/315 (2023.02); H10B 12/033 (2023.02)

(58) Field of Classification Search
CPC ............................ H10B 12/033; H10B 12/315
See application file for complete search history.

(56) References Cited

U.S. PATENT DOCUMENTS

2017/0236894 A1　8/2017　Kim
2022/0189962 A1*　6/2022　Han ........................ H10B 12/34

FOREIGN PATENT DOCUMENTS

KR　　20110071355 A　*　6/2011　............. H10D 1/042

* cited by examiner

*Primary Examiner* — Brent A. Fairbanks
*Assistant Examiner* — Molly K Reida
(74) *Attorney, Agent, or Firm* — Winston Hsu

(57)　　　ABSTRACT

A semiconductor memory device includes a substrate, a plurality of bottom electrodes arranged on the substrate along a row direction and a column direction to form an array. The row direction and the column direction are perpendicular. A supporting layer is disposed on the substrate and in direct contact with the bottom electrodes to support the bottom electrodes. At least a first slit, at least a second slit, and at least a third slit that extend along different directions are formed in the supporting layer and partially expose sidewalls of the bottom electrodes.

18 Claims, 12 Drawing Sheets

26 30 31
BE

A—————A'

D2
↑
└——→D1

SEMICONDUCTOR MEMORY DEVICE AND METHOD FOR FORMING THE SAME

BACKGROUND OF THE INVENTION

1. Field of the Invention

The present invention relates to a semiconductor memory device and a method for forming the same. More particularly, the present invention relates to a semiconductor memory device including stacked capacitors and a method for forming the same.

2. Description of the Prior Art

A dynamic random access memory (DRAM) device is a kind of volatile memory. A DRAM device usually includes a memory region including an array of memory cells and a peripheral region including control circuits. Typically, a memory cell is composed of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In recently years, high-density and high integrity DRAM devices with larger storage capacities are earnestly required in the industry to produce smaller and advanced electronic products. 3D memory cells have been proposed in the field to meet the above requirements by forming capacitors stacked on the substrate and above the transistors or buried in trenches in the substrate, wherein stacked capacitor cells have become the mainstream because the capacitances of stacked capacitors may be increased for a better device performance by simply increasing the vertical heights of the stacked capacitors. However, the stacked capacitors have problems need to be solved, such as structural damages and degraded reliability due to their higher susceptibility to stress impact.

SUMMARY OF THE INVENTION

One objective of the present invention is to provide a semiconductor memory device including stacked capacitors and a method for forming the same.

One embodiment of the present invention provides a semiconductor memory device including a substrate, a plurality of bottom electrodes arranged on the substrate along a row direction and a column direction to form an array, wherein the row direction and the column direction are perpendicular, a supporting layer disposed on the substrate and in direct contact with the bottom electrodes to support the bottom electrodes, and at least a first slit, at least a second slit, and at least a third slit formed in the supporting layer, having three different extending directions, and partially exposing sidewalls of the bottom electrodes.

Another embodiment of the present invention provides a semiconductor memory device including a substrate, a plurality of bottom electrodes arranged on the substrate along a row direction and a column direction to form an array, wherein the row direction and the column direction are perpendicular, a supporting layer disposed on the substrate and in direct contact with the bottom electrodes to support the bottom electrodes, and at least a slit formed in the supporting layer with two ends extending to edges of the supporting layer, wherein an extending direction of the slit is different from the row direction and the column direction.

Another embodiment of the present invention provides a method for forming a semiconductor memory device. The method includes the steps of providing a substrate with a sacrificial layer and a supporting layer disposed thereon, forming a plurality of bottom electrodes on the substrate and through the sacrificial layer and a supporting layer, wherein the bottom electrodes are arranged along a row direction and a column direction to form an array, and the row direction and the column direction are perpendicular, forming at least a first slit, at least a second slit, and at least a third slit in the supporting layer and having three different extending directions, removing the sacrificial layer through the first slit, the second slit, and the third slit to form a cavity between the substrate and the supporting layer and exposing sidewalls of the bottom electrodes, forming a capacitor dielectric layer along the sidewalls of the bottom electrodes and surfaces of the supporting layer, and forming a top electrode on the capacitor dielectric layer and filling the cavity.

One feature of the present invention is that, the slits formed in the supporting layer may mitigate the stress on the stacked capacitors, so that structural collapse or cracks caused by stress mismatch may be reduced. A better device reliability and yield may be achieved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1 to FIG. 7 are exemplary drawings illustrating a method for forming a semiconductor memory device according to an embodiment of the present invention, wherein:

FIG. 1 is a schematic cross-sectional view of the semiconductor memory device after forming a sacrificial layer and a supporting layer on a substrate;

FIG. 2 is a schematic plan view of the semiconductor memory device after forming the bottom electrodes on the substrate;

FIG. 3 is a schematic cross-sectional view of the semiconductor memory device shown in FIG. 2 along the line A-A';

FIG. 4 is a schematic plan view of the semiconductor memory device after forming openings and slits in the supporting layer;

FIG. 5 is a schematic cross-sectional view of the semiconductor memory device shown in FIG. 4 along the line A-A';

FIG. 6 is a schematic cross-sectional view of the semiconductor memory device after removing the sacrificial layer; and FIG. 7 is a schematic cross-sectional view of the semiconductor memory device after forming a capacitor dielectric layer and a top electrode.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
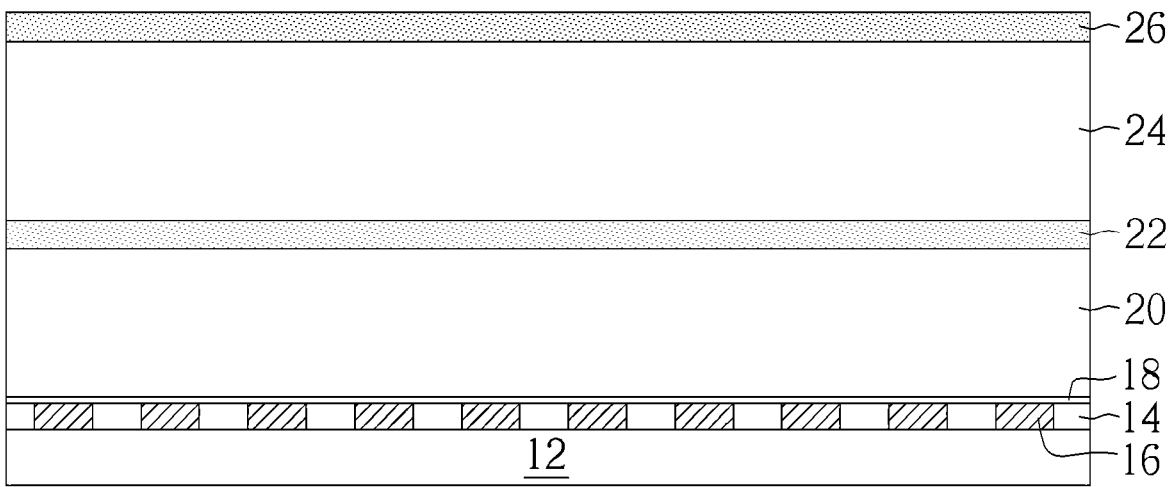

FIG. 1 to FIG. 7 are exemplary drawings illustrating a method for forming a semiconductor memory device according to an embodiment of the present invention. First, as shown in FIG. 1, a substrate 12 is provided. An interlayer dielectric layer 14 is formed on the substrate 12 and a plurality of storage node contact pads 16 are formed in the interlayer dielectric layer 14. Subsequently, a stack structure of dielectric material layers is formed on the interlayer dielectric layer 14. In this embodiment, the stack structure may include, from bottom to top, an etching stop layer 18, a sacrificial layer 20 (lower sacrificial layer), a supporting layer 22 (lower supporting layer), a sacrificial layer 24 (upper sacrificial layer), and a supporting layer 26 (upper supporting layer). In other embodiments, the sacrificial layer 20 and supporting layer 22 may be omitted, and the sacrificial layer 24 is directly formed on the etching stop layer 18. Still in other embodiments, a sacrificial layer (not shown) or a hard mask layer (not shown) may be additionally formed on the supporting layer 26.

The substrate 12 may be a silicon substrate, an epitaxial silicon substrate, a silicon germanium (SiGe) substrate, a silicon carbide (SiC) substrate, or a silicon-on-insulator (SOI) substrate, but is not limited thereto. The substrate 12 may include semiconductor devices and circuit elements formed therein, such as transistors, buried word lines, bit lines, contact plugs, but are not limited thereto. The semiconductor devices and circuit elements are not shown in the drawings for simplicity. The interlayer dielectric layer 14 is essentially made of a dielectric material, such as silicon oxide ($SiO_2$), silicon nitride (SiN), silicon oxynitride (SiON), silicon carbon nitride (SiCN), high-k dielectric material, or a combination thereof, but is not limited thereto. According to an embodiment of the present invention, the interlayer dielectric layer 14 is essentially made of silicon nitride (SiN). The storage node contact pads 16 are essentially made of a conductive material. Suitable conductive material for the storage node contact pads 16 may include metal, such as tungsten (W), copper (Cu), aluminum (Al), titanium (Ti), tantalum (Ta), or a compound, alloy, or composite layer of the above metal materials, but is not limited thereto. According to an embodiment of the present invention, the storage node contact pads 16 are essentially made of tungsten (W). The storage node contact pads 16 are arranged in an array with equal spacing. The storage node contact pads 16 are used to electrically connect the bottom electrodes BE (shown in FIG. 3) and the source/drain regions of the transistors of the memory cells that are formed in the substrate 12. The etching stop layer 18, the sacrificial layer 20, the sacrificial layer 24, the supporting layer 22, and the supporting layer 26 are respectively made of dielectric materials. The sacrificial layer 20 and the sacrificial layer 24 are made of materials have etching selectivity to the supporting layer 22 and the supporting layer 26, so that the sacrificial layer 20 and the sacrificial layer 24 may be selectively etched and removed from the stack structure to form cavities 32 (shown in FIG. 6) between the substrate 12, the supporting layer 22, and the supporting layer 26, exposing the sidewalls of the bottom electrodes BE. According to an embodiment of the present invention, the sacrificial layer 20 and the sacrificial layer 24 are essentially made of an oxide dielectric material, such as silicon oxide ($SiO_2$) or borophosphosilicate glass (BPSG), but are not limited thereto. The supporting layer 22 and the supporting layer 26 are essentially made of a nitride dielectric material, such as silicon carbon nitride (SiCN) or silicon nitride (SiN), but are not limited thereto.

Figure 2:
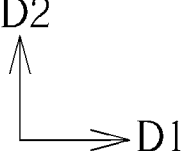
Figure 3:
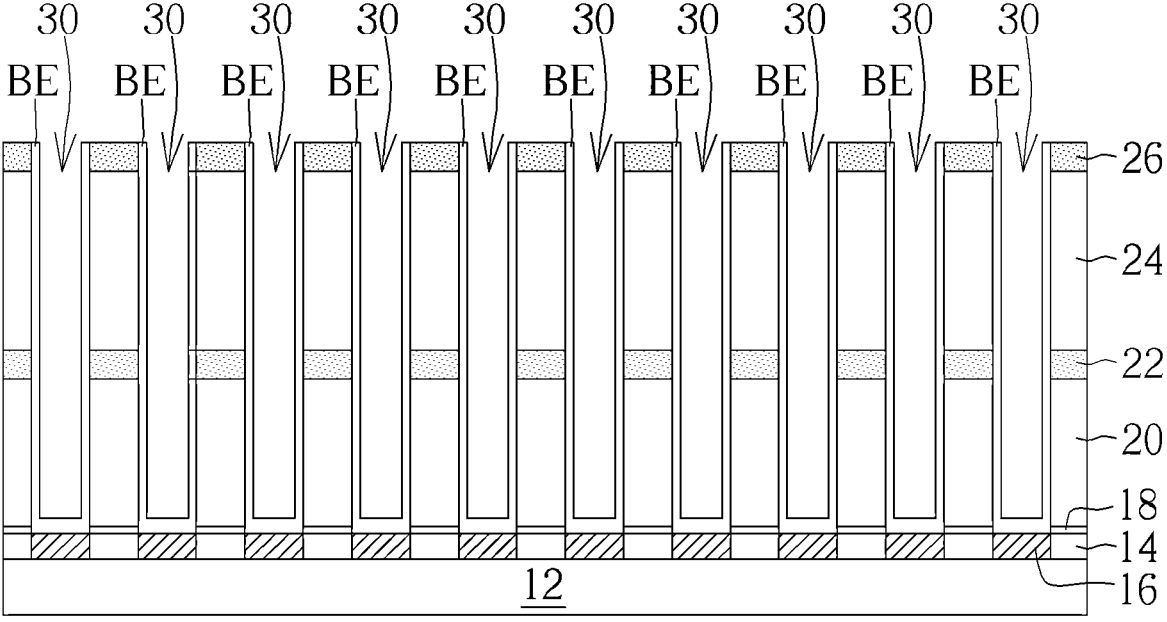

Please refer to FIG. 2 and FIG. 3. Next, an etching process is performed to etch the stack structure to form a plurality of bottom electrode holes 30 that respectively extend through the supporting layer 26, the sacrificial layer 24, the supporting layer 22, the sacrificial layer 20, and the etching stop layer 18, exposing surfaces of the storage node contact pads 16. Following, the bottom electrodes BE are formed respectively in the bottom electrode holes 30 by filling a conductive material in the bottom electrode holes 30. The bottom electrode holes 30 are substantially aligned to the storage node contact pads 16, with the bottom ends thereof directly contacting and electrically connecting to the storage node contact pads 16. The height of the bottom electrodes BE are substantially determined by the overall thickness of the stack structure. The conductive material suitable for forming the bottom electrodes BE may include a metal, such as tungsten (W), copper (Cu), aluminum (Al), titanium (Ti), tantalum (Ta), or a compound, alloy, or composite layer of the above metal materials, but is not limited thereto. According to an embodiment of the present invention, the bottom electrodes BE are essentially made of titanium (Ti).

As shown in FIG. 2 and FIG. 3, the bottom electrode holes 30 are arranged in an array along the row direction D1 and the column direction D2. The row direction D1 and the column direction D2 are perpendicular to each other. The bottom electrodes BE of adjacent rows are staggered along the column direction D2 in a zigzag pattern, such that as a whole, the bottom electrodes BE are arranged in an array of hexagonal close-packed configuration.

Figure 13:
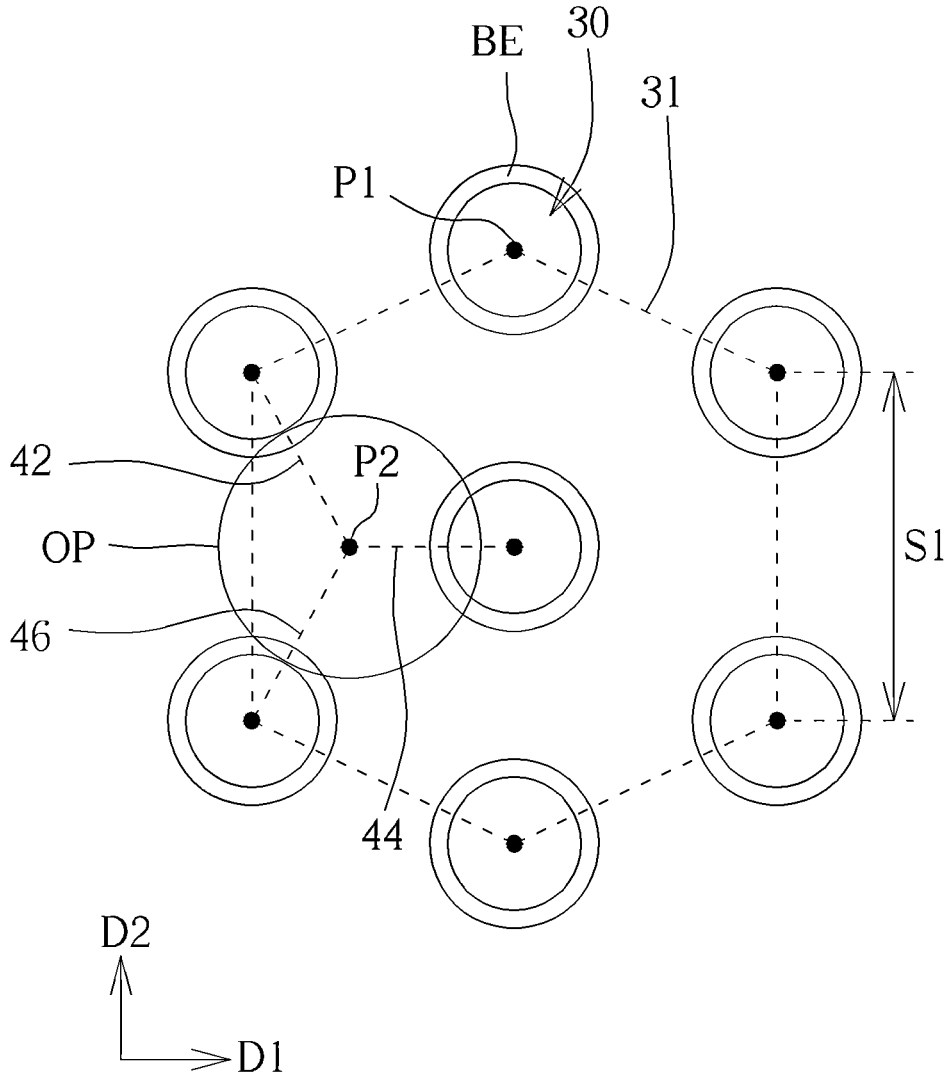
FIG. 13 is a schematic drawing illustrating the hexagonal arrangement of bottom electrodes and the relative position of an opening of the supporting layer and the associated bottom electrodes according to an embodiment of the present invention.

An aerial hexagonal pattern 31 is shown in FIG. 2 to illustrate the hexagonal array of the bottom electrodes BE. FIG. 13 is an enlarged view of the hexagonal pattern 31 and the corresponding bottom electrodes BE. The bottom electrode BE located at the center of the hexagonal pattern 31 is surrounded by six bottom electrodes BE respectively located at the six corners of the hexagonal pattern 31. The length of the edges of the hexagonal pattern 31 is substantially equal to the distance S1 between the center points P1 of two adjacent bottom electrodes BE.

In this embodiment, the bottom electrodes BE are respectively made with a hollow cylindrical shape by forming the conductive material conformally along the sidewalls and bottom surfaces of the bottom electrode holes 30. In other embodiments, the bottom electrodes BE may respectively have a solid cylindrical shape (pillar shape) by completely filling the bottom electrode holes 30 with the conductive material.

Figure 4:
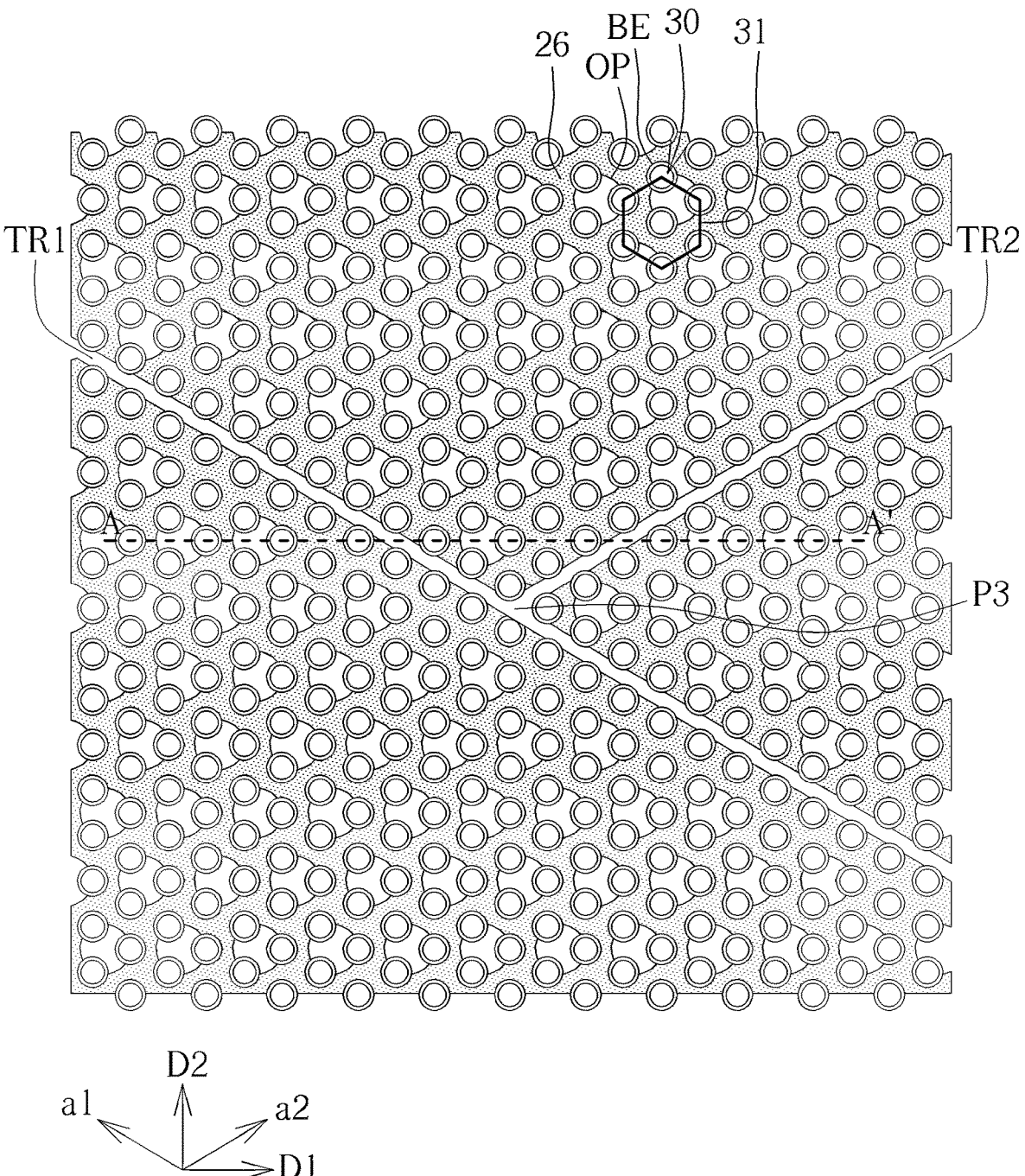
Figure 5:
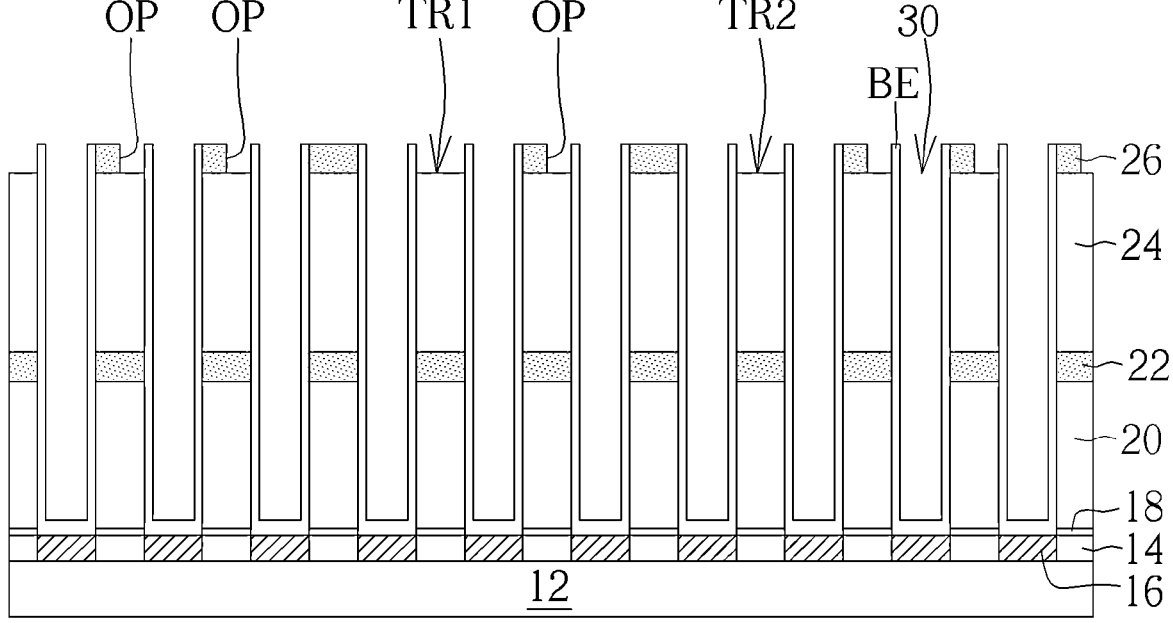

Please refer to FIG. 4 and FIG. 5, and also refer to FIG. 13. After forming the bottom electrodes BE, an etching process is performed to etch and pattern the supporting layer 26, defining a plurality of openings OP and slit TR1 and slit TR2 in the supporting layer 26. As shown in FIG. 4, the openings OP are substantially circular and respectively located between three adjacent bottom electrodes BE. The openings OP are partially overlapped with the bottom electrodes BE and expose portions of sidewalls of the bottom electrodes BE. In some embodiments, as shown in FIG. 13, the angles between the aerial extending lines 42, 44, 46 from the center point P2 of the opening OP to the center points P1 of the three bottom electrodes BE that are overlapped with the opening OP are approximately the same. For example, the angles between the extending lines 42, 44, 46 are approximately 120 degrees. In the embodiment shown in FIG. 4, the extending line 44 is approximately parallel to the row direction D1. The openings OP may be made in shapes other than circular as shown in FIG. 4. For example, the shape of the openings OP may be rectangle, ellipse, or a closed-ring, but is not limited thereto.

As shown in FIG. 4, the slit TR1 and the slit TR2 extend linearly between the bottom electrodes BE along the first direction a1 and the second direction a2 respectively, partially overlap with the bottom electrodes BE and expose portions of sidewalls of the bottom electrodes BE, and are connected at an intersection region P3. The first direction a1 and the second direction a2 are different form the row direction D1 and the column direction D2, and include an angle larger than 90 degrees (that is, the angle between the slit TR1 and the slit TR2 is larger than 90 degrees). In this embodiment, the first direction a1 and the second direction a2 are respectively and approximately parallel to two adjacent edges of the hexagonal pattern 31. The angle between the first direction a1 and the second direction a2 (the angle between the slit TR1 and the slit TR2) is approximately 120 degrees.

The lengths of the slit TR1 and the slit TR2 may be adjusted according to design needs. According to an embodiment of the present invention, the slit TR1 and the slit TR2 respectively have a length that may expose sidewalls of more than 10 bottom electrodes (at the same side of the slit). According to an embodiment of the present invention, at least one of the slit TR1 and the slit TR2 may extend across the entire surface of the supporting layer 26, with the two ends thereof flush with the edges of the supporting layer 26.

The widths of the slit TR1 and the slit TR2 are controlled to be not more than twice the distance S1 between bottom electrodes BE to prevent any of the bottom electrodes BE from being completely separated from the supporting layer 26 for being surrounded by the slit TR1 or the slit TR2 and therefore losing supports from the supporting layer 26. According to an embodiment of the present invention, the widths of the slit TR1 and the slit TR2 are 0.8 to 1.5 times of the distance S1, respectively.

The openings OP are formed regularly in the supporting layer. However, in the embodiment as shown in FIG. 4, the openings OP may be optionally omitted and not formed in the regions where the slit TR1 or the slit TR2 pass through, so as to ensure the bottom electrodes BE exposed by the slit TR1 and the slit TR2 being sufficient contacted and securely supported by the supporting layer 26. In some cases, the slit TR1 and the slit TR2 do not overlap with any of the openings OP.

In some embodiments, the regions of the supporting layer 26 where the slit TR1 or the slit TR2 pass through may optionally have openings OP formed therein when the openings do not cause insufficient supports for the bottom electrodes BE. In this case, the openings OP may be incorporated as a part of the slit TR1 or the slit TR2, so that the slit TR1 or the slit TR2 may have obvious jagged profile (not shown).

Figure 6:
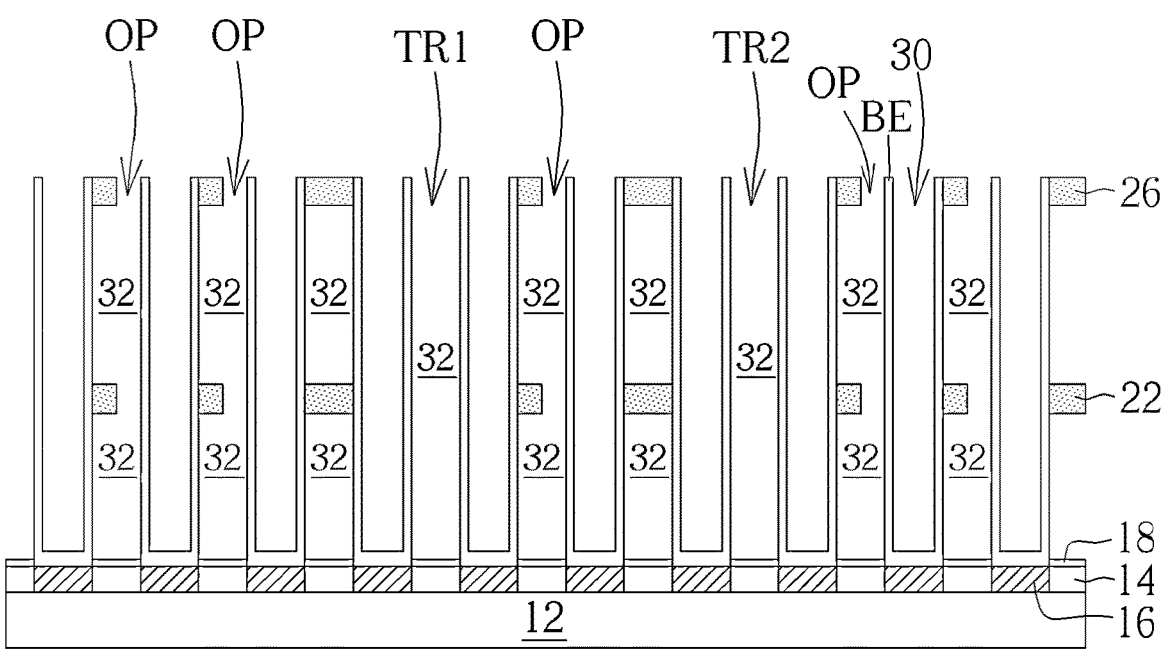

Please refer to FIG. 5 and FIG. 6. Subsequently, a selective etching process is performed to etch and remove the sacrificial layer 24 and the sacrificial layer 20 through the openings OP, the slit TR1 and the slit TR2, thereby forming a cavity 32 extending horizontally between the supporting layer 26 and the supporting layer 22 and another cavity 32 extending horizontally between the supporting layer 22 and the etching stop layer 18, exposing portions of the sidewalls of the bottom electrodes BE. The selective etching process may include multiple etching stages, such as a first etching stage to remove the sacrificial layer 24 until the supporting layer 22 being exposed, a second etching stage to etch the supporting layer 22 to form opening to expose the sacrificial layer 20, and a third etching stage to remove the remaining sacrificial layer 24 and the sacrificial layer 20.

Figure 7:
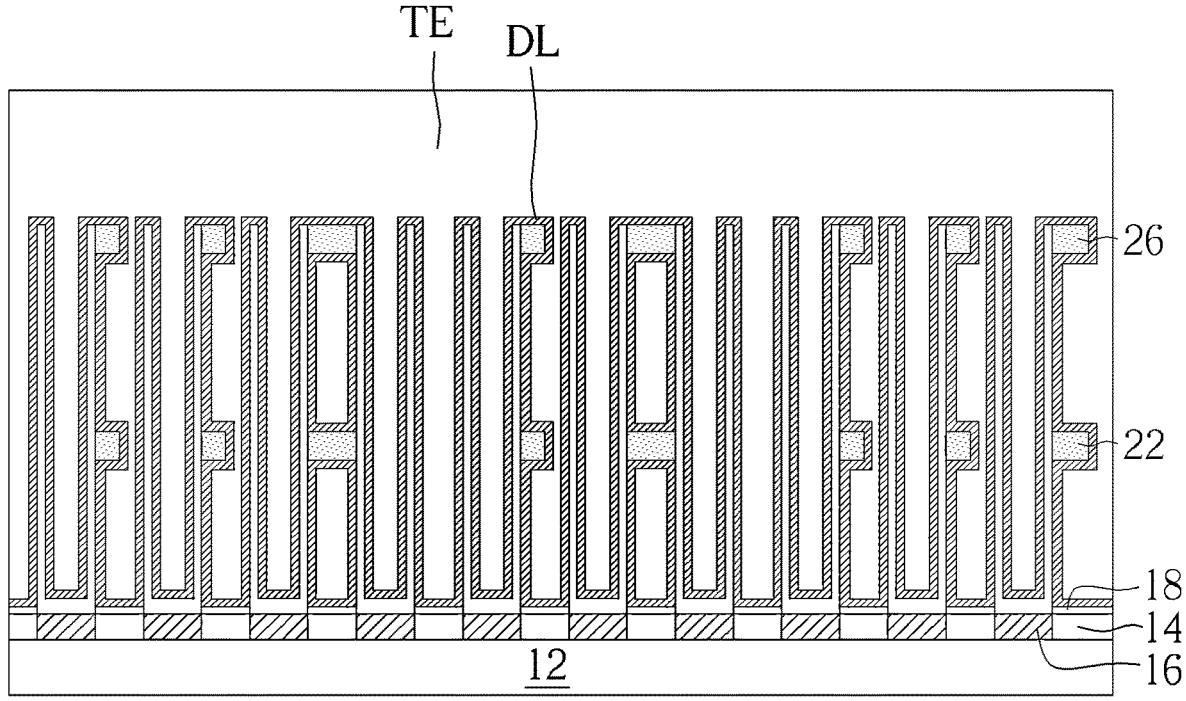

Please refer to FIG. 7. Subsequently, a capacitor dielectric layer DL is formed conformally along the exposed sidewalls of the bottom electrodes BE and surfaces of the supporting layer 26, the supporting layer 22, and the etching stop layer 18. Following, a top electrode TE is formed on the capacitor dielectric layer DL and fills the cavities 32 and the remaining spaces of the bottom electrode holes 30, thereby forming the stacked capacitors. At this point, the semiconductor memory device provided by the present invention is obtained. The capacitor dielectric layer DL is essentially made of a dielectric material, such as silicon oxide (SiO2), silicon nitride (SiN), silicon oxynitride (SiON), silicon carbon nitride (SiCN), high-k dielectric material, or a combination thereof, but is not limited thereto. The top electrode TE is essentially made of a conductive material. Suitable conductive material for the top electrode TE may include metal, such as tungsten (W), copper (Cu), aluminum (Al), titanium (Ti), tantalum (Ta), or a compound, alloy, or composite layer of the above metal materials, but is not limited thereto. According to an embodiment of the present invention, the top electrode TE is essentially made of titanium (Ti).

Please refer to FIG. 7 and FIG. 4. The semiconductor memory device provided by the present invention includes a substrate 12, a plurality of bottom electrodes BE disposed on the substrate 12 and arranged along a row direction D1 and a column direction D2 to form an array. A supporting layer 26 is disposed on the substrate 12 and in direct contact with the bottom electrodes BE to support the bottom electrodes BE. A plurality of openings OP, a linear slit TR1 and another linear slit TR2 are defined in the supporting layer 26. A capacitor dielectric layer DL covers along the sidewalls of the bottom electrodes BE and the surfaces (the upper surface and the lower surface) of the supporting layer 26. A top electrode TE covers on the capacitor dielectric layer DL and surrounds each of the bottom electrodes BE. In the embodiment shown in FIG. 7, the top electrode TE also fills the internal spaces of the hollow-cylindrical shaped bottom electrodes BE to increase the capacitive coupling area between each of the bottom electrodes BE and the top electrode TE, such that the capacitances of the stacked capacitors may be increased, and an improved data retention time and device stability may be obtained. One feature of the present invention is that, the slit TR1 and slit TR2 which extend linearly in the supporting layer along different directions may mitigate stress accumulated on the stacked capacitors, so that structural collapse or cracks caused by stress mismatch may be reduced. A better device reliability and yield may be achieved. In some embodiments, at least an additional supporting layer 22 may be provided between the supporting layer 26 and the substrate 12, directly contacting the sidewalls of middle portions of the bottom electrodes BE to provide assistant support to the bottom electrodes BE. In some embodiments, the design patterns of the openings OP, the slit TR1 and the slit TR2 may be transferred to the supporting layer 22, forming corresponding openings and slits (not shown) in the supporting layer 22 by the selective etching process (shown in FIG. 6).

The numbers, extending directions, and patterns of the slits in the supporting layer of the semiconductor memory device provided by the present invention are not limited to the embodiment shown in FIG. 4, and may be adjusted according to design needs. The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Please refer to FIG. 8 to FIG. 12, which are exemplary drawings showing plan views of the semiconductor memory device after patterning the upper supporting layer according to some embodiments of the present invention. The bottom electrodes and openings in the upper supporting layer are not shown in FIG. 12 to simplify the drawing.

Figure 8:
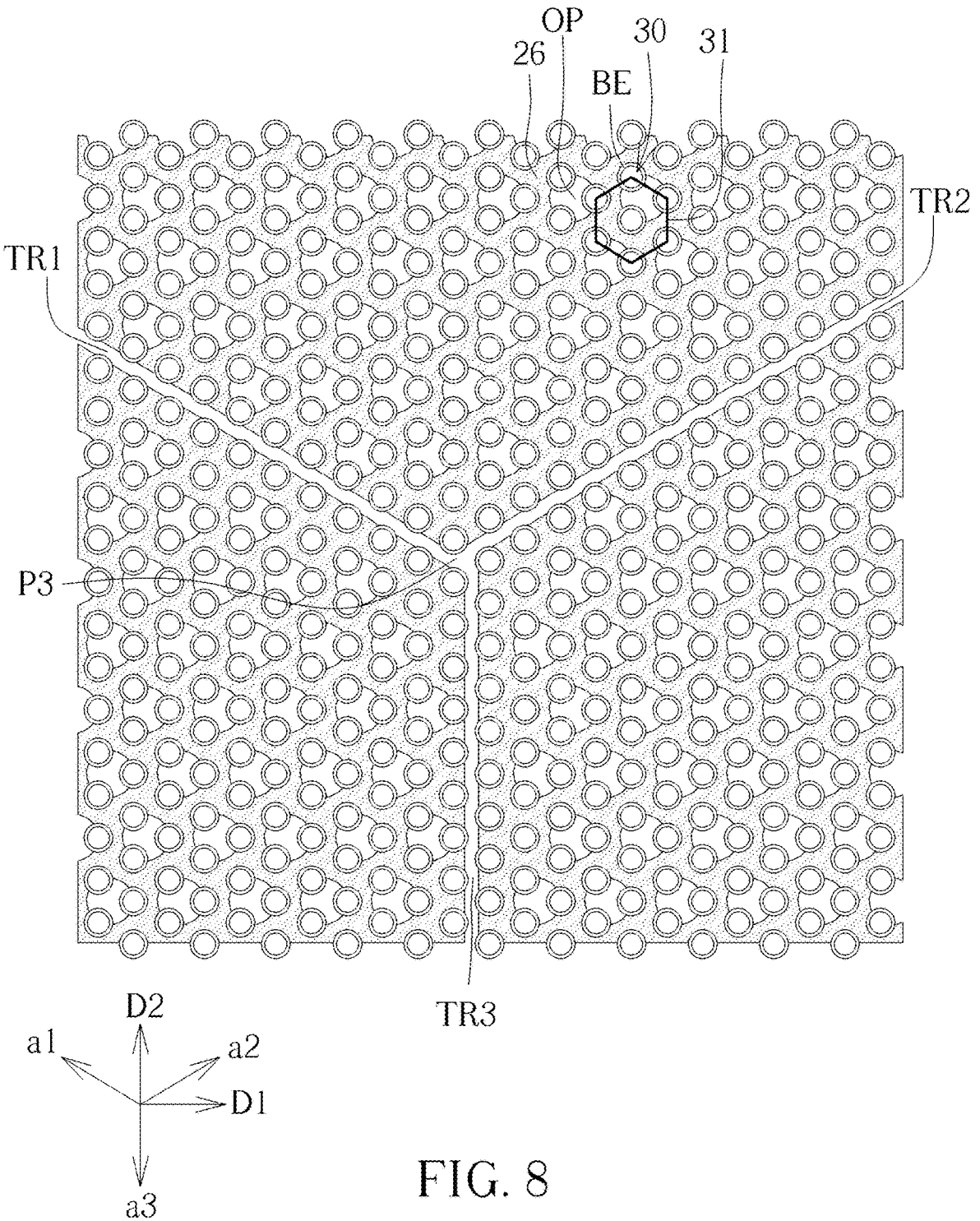
FIG. 8 to FIG. 12 are exemplary drawings showing plan views of the semiconductor memory device after forming openings and slits in the supporting layer according to some embodiments of the present invention.

In the embodiment shown in FIG. 8, the supporting layer 26 includes a plurality of opening OP, a slit TR1 extending along the first direction a1, a slit TR2 extending along the second direction a2, and a slit TR3 extending along the third direction a3. The first direction a1, the second direction a2, and the third direction a3 are different directions. The ends of the slit TR1, the slit TR2, and the slit TR3 are connected at an intersection region P3 to form a radial pattern. Any two of the first direction a1, the second direction a2, and the third direction a3 include an angle larger than 90 degrees (that is, the angle between any two of the slit TR1, the slit TR2, and the slit TR3 is larger than 90 degrees). In this embodiment, the first direction a1 and the second direction a2 are respectively and approximately parallel to two adjacent edges of the hexagonal pattern 31, the third direction a3 is approximately parallel to the column direction D2, and the first direction a1, the second direction a2, and the third direction a3 include an angle of approximately 120 degrees between each other.

Figure 9:
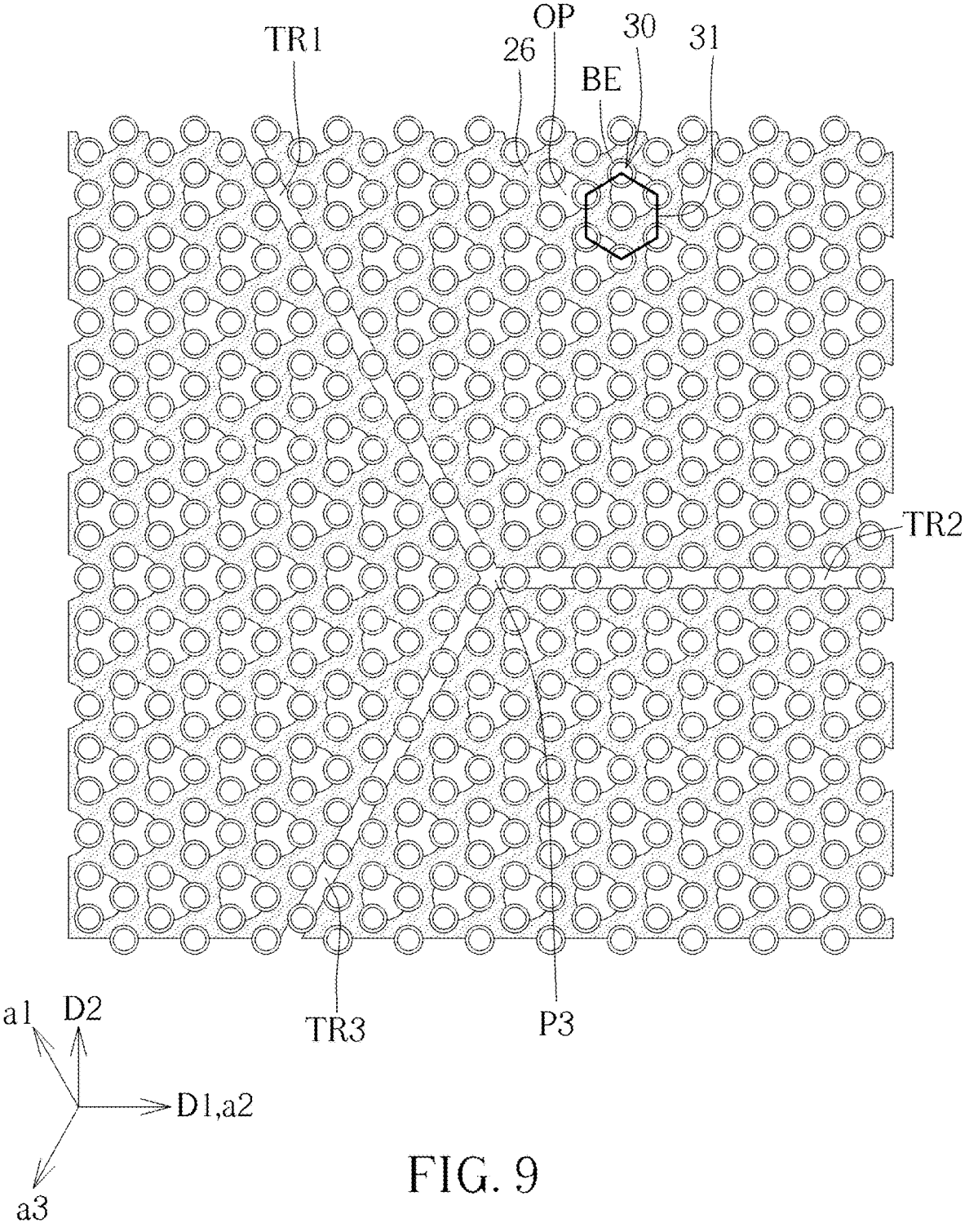

In the embodiment shown in FIG. 9, the supporting layer 26 includes a plurality of opening OP, a slit TR1 extending along the first direction a1, a slit TR2 extending along the second direction a2, and a slit TR3 extending along the third direction a3. The first direction a1, the second direction a2, and the third direction a3 are different directions. The ends of the slit TR1, the slit TR2, and the slit TR3 are connected at an intersection region P3 to form a radial pattern. A difference between the embodiment shown in FIG. 9 and the embodiment shown in FIG. 8 is that, the first direction a1, the second direction a2, and the third direction a3 shown in FIG. 9 are respectively and approximately parallel to the aerial extending lines 42, 44, 46 (see FIG. 13, the lines from the center point P2 of the opening OP to the center points P1 of the three bottom electrodes BE that are overlapped with the opening OP), and include an angle of approximately 120 degrees between each other. In this embodiment, the slit TR2 (the second direction a2) is approximately parallel to the row direction D1. In some embodiments, the slit TR1, the slit TR2, and the slit TR3 are respectively along the lines through the center points of the bottom electrodes BE, partially exposing sidewalls of opposite sides of the bottom electrodes BE. It should be noted that the widths of the slit TR1, the slit TR2, and the slit TR3 are preferably controlled within a range smaller than the diameter d2 of the bottom electrodes BE to prevent any of the bottom electrodes BE from being completely separated from the supporting layer 26 for being completely surrounded by the slit TR1, the slit TR2, or the slit TR3 and therefore losing supports from the supporting layer 26.

Figure 10:
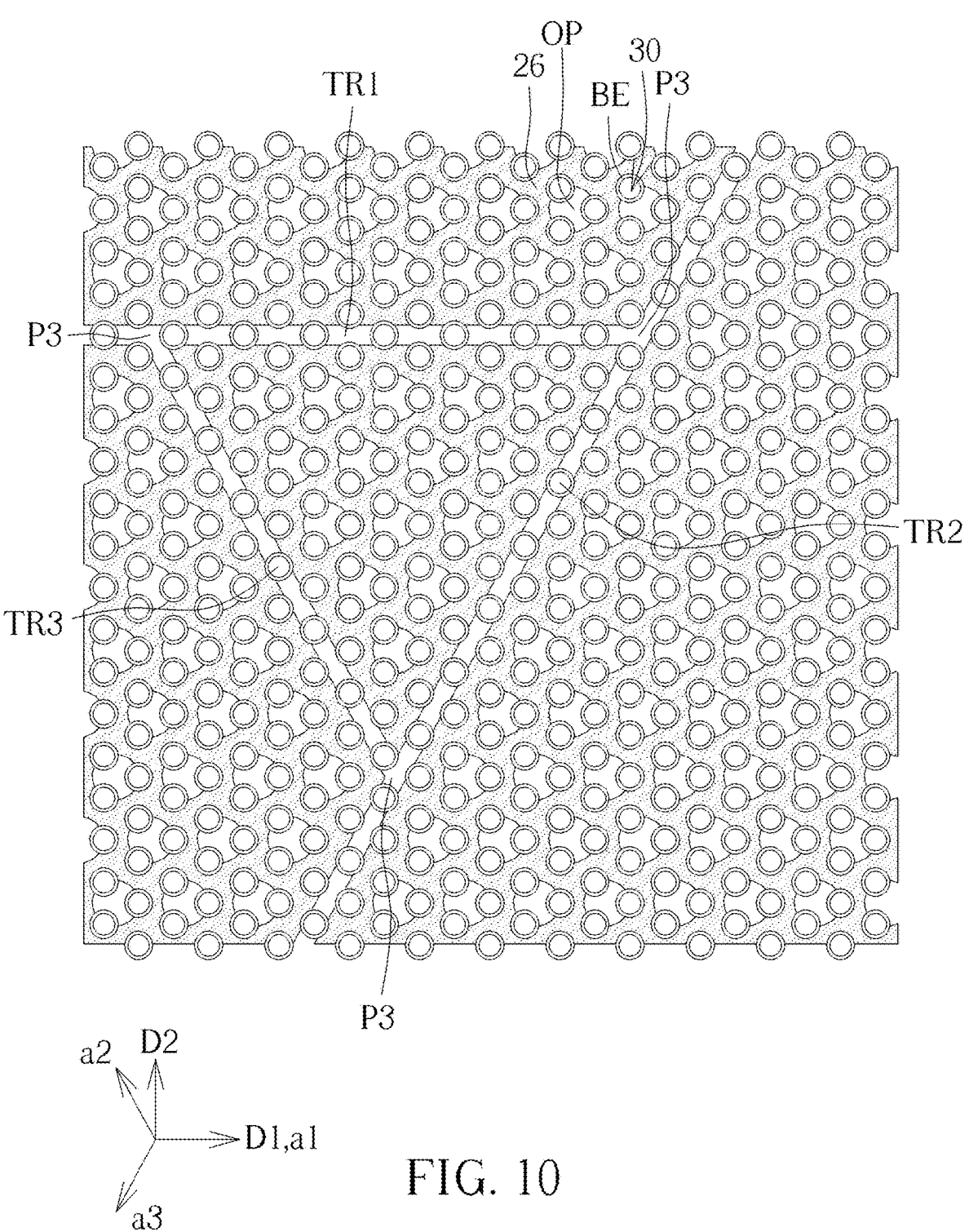

In the embodiment shown in FIG. 10, the supporting layer 26 includes a plurality of opening OP, a slit TR1 extending along the first direction a1, a slit TR2 extending along the second direction a2, and a slit TR3 extending along the third direction a3. The first direction a1, the second direction a2, and the third direction a3 are different directions. The ends of the slit TR1, the slit TR2, and the slit TR3 are connected at three intersection regions P3 to form a closed pattern. The first direction a1, the second direction a2, and the third direction a3 shown in FIG. 9 are respectively and approximately parallel to the aerial extending lines 42, 44, 46 (shown in FIG. 13), and include an angle of approximately 120 degrees between each other. In some embodiments, the slit TR1, the slit TR2, and the slit TR3 are respectively along the lines through the center points of the bottom electrodes BE, partially exposing sidewalls of opposite sides of the bottom electrodes BE. At least one of the slit TR1, the slit TR2, and the slit TR3 (for example, the slit TR2 in FIG. 10) may extend across the entire surface of the supporting layer 26, with the two ends thereof flush with the edges of the supporting layer 26.

Figure 11:
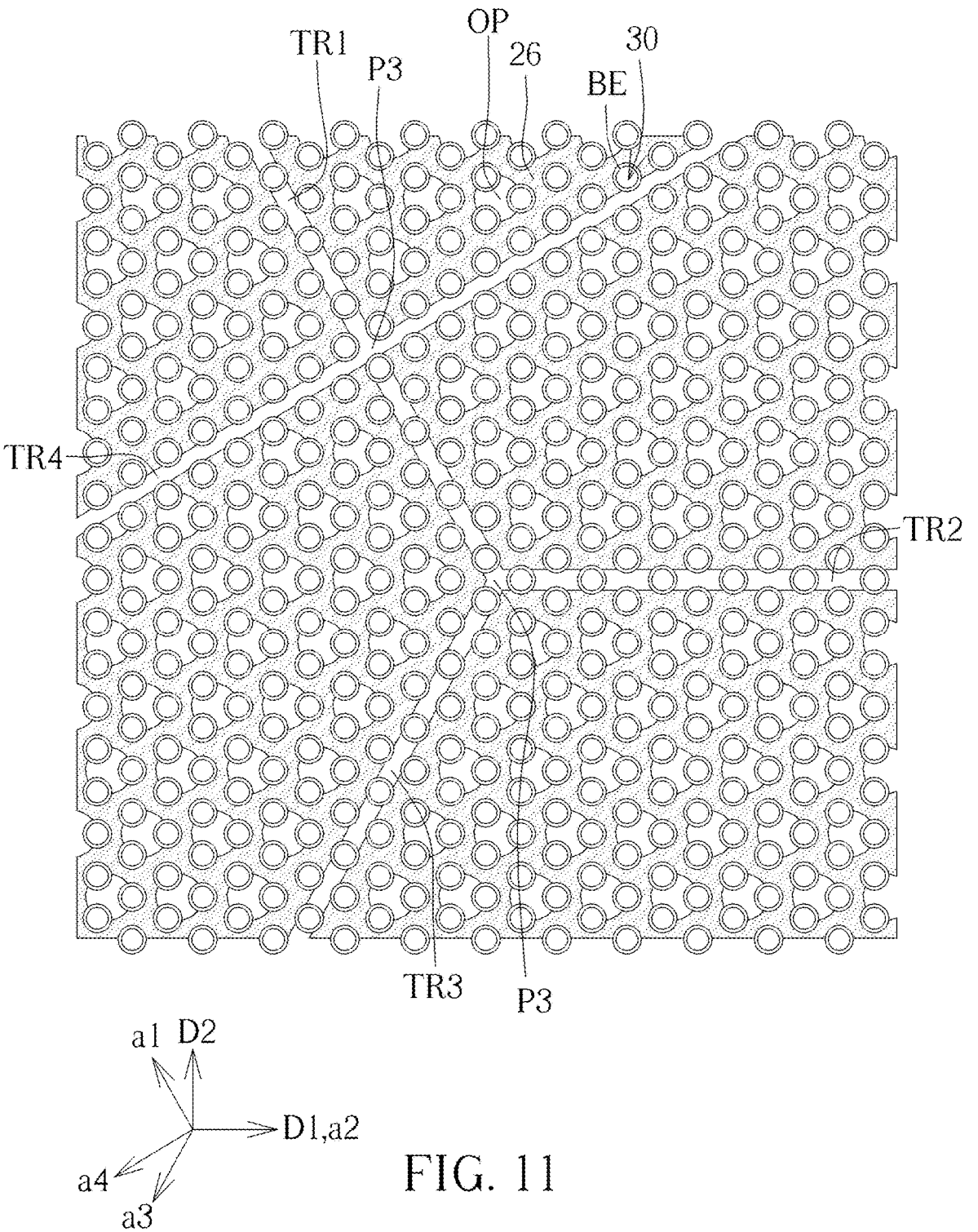

In the embodiment shown in FIG. 11, the supporting layer 26 includes a plurality of opening OP, a slit TR1 extending along the first direction a1, a slit TR2 extending along the second direction a2, and a slit TR3 extending along the third direction a3. The detailed description of the slit TR1, the slit TR2, and the slit TR3 may be referred to the embodiment described in FIG. 9, and will not be repeated herein. A difference between the embodiment shown in FIG. 11 and the embodiment shown in FIG. 9 is that, the supporting layer 26 shown in FIG. 11 further includes a slit TR4 extending along a fourth direction a4 that is different from the first direction a1, the second direction a2, and the third direction a3. In some embodiments, the fourth direction a4 may be parallel to an edge of the hexagonal pattern 31 (see FIG. 9 or FIG. 13). The slit TR4 may intersect with at least one of the slit TR1, the slit TR2, and the slit TR3 (for example, the slit TR1 in FIG. 11) to form another radial pattern.

Figure 12:
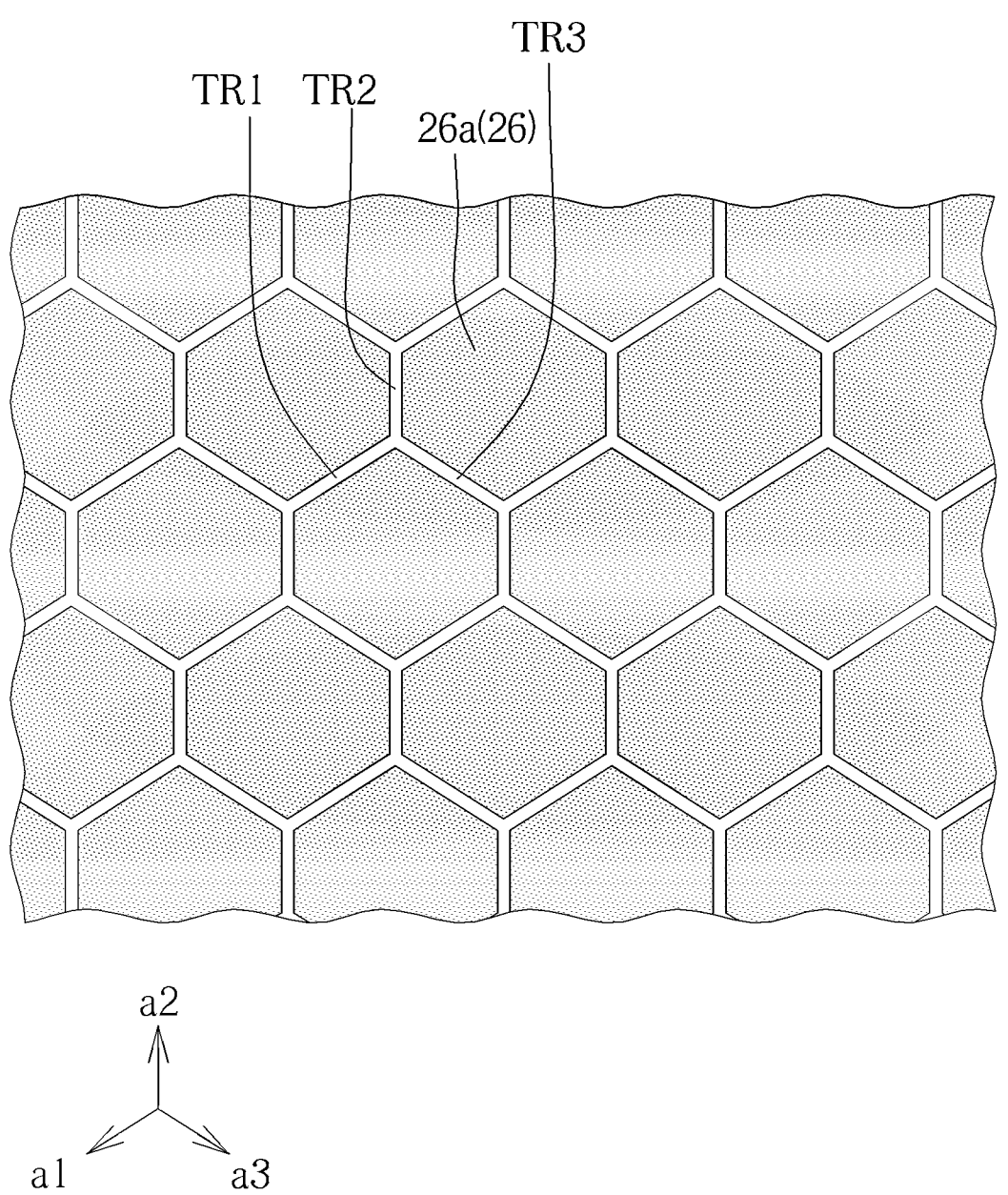

In some embodiments, the supporting layer 26 may include more slits extending in different directions and being connected to form a mesh pattern. For example, as shown in FIG. 12, the supporting layer 26 includes a plurality of slits TR1 extending along the first direction a1, a plurality of slits TR2 extending along the second direction a2, and a plurality of slits TR3 extending along the third direction a3, wherein the slits TR1, TR2 and TR3 are connected to each other to collectively form a mesh pattern, dividing the supporting layer 26 into a plurality of separated regions 26a. The detailed description of the slits TR1, the slits TR2, and the slits TR3 may be referred to the embodiments described in FIG. 8 or FIG. 9, and will not be repeated herein. The regions 26a of the supporting layer 26 may have the same or different shapes or areas, which are defined by the extending directions and lengths of the slits TR1, the slits TR2, and the slits TR3. In some embodiments, the regions 26a have the same hexagonal shape, but are not limited thereto.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate;
a plurality of bottom electrodes arranged on the substrate along a row direction and a column direction to form an array, wherein the row direction and the column direction are perpendicular;
a supporting layer disposed on the substrate and in direct contact with the bottom electrodes to support the bottom electrodes; and
at least a first slit formed in the supporting layer and extending in a first direction, at least a second slit formed in the supporting layer and extending in a second direction, and at least a third slit formed in the supporting layer and extending in a third direction, wherein each of the first direction, the second direction, and the third direction are different, and wherein each of the first slit, the second slit, and the third slit expose sidewalls of the bottom electrode; and
a plurality of openings formed in the supporting layer, wherein each of the openings is located between adjacent three of the bottom electrodes and partially exposes sidewalls of the adjacent three of the bottom electrodes.

2. The semiconductor memory device according to claim 1, wherein the first slit, the second slit, and the third slit are connected to form a closed pattern.

3. The semiconductor memory device according to claim 1, wherein the first slit, the second slit, and the third slit are connected to form a radial pattern.

4. The semiconductor memory device according to claim 1, wherein one of the first slit, the second slit, and the third slit is extending along the row direction or the column direction.

5. The semiconductor memory device according to claim 4, wherein an angle between any two of the first slit, the second slit, and the third slit is larger than 90 degrees.

6. The semiconductor memory device according to claim 1, further comprising at least a fourth slit having an extending direction different from the three different extending directions of the first slit, the second slit, and the third slit.

7. The semiconductor memory device according to claim 1, wherein a plurality of the first slits, a plurality of the second slits, and a plurality of the third slits are formed in the supporting layer and are connected to form a mesh pattern.

8. The semiconductor memory device according to claim 1, wherein the first slit, the second slit, and the third slit respectively partially expose sidewalls of more than 10 of the bottom electrodes.

9. The semiconductor memory device according to claim 1, further comprising:
a capacitor dielectric layer covering along the bottom electrodes and the supporting layer; and
a top electrode covering on the capacitor dielectric layer.

10. A semiconductor memory device, comprising:
a substrate;
a plurality of bottom electrodes arranged on the substrate along a row direction and a column direction to form an array, wherein the row direction and the column direction are perpendicular;
a supporting layer disposed on the substrate and in direct contact with the bottom electrodes to support the bottom electrodes;
at least a slit formed in the supporting layer with two ends extending to edges of the supporting layer, wherein an extending direction of the slit is different from the row direction and the column direction; and
a plurality of openings formed in the supporting layer, wherein each of the openings is located between adjacent three of the bottom electrodes and partially exposes sidewalls of the adjacent three of the bottom electrodes.

11. A semiconductor memory device, comprising:
a substrate;
a plurality of bottom electrodes arranged on the substrate along a row direction and a column direction to form an array, wherein the row direction and the column direction are perpendicular;
a supporting layer disposed on the substrate and in direct contact with the bottom electrodes to support the bottom electrodes; and
at least a first slit formed in the supporting layer and extending in a first direction, at least a second slit formed in the supporting layer and extending in a second direction, at least a third slit formed in the supporting layer and extending in a third direction, and at least a fourth slit formed in the supporting layer and extending in a fourth direction, wherein each of the first direction, the second direction, the third direction, and the fourth direction are different, and wherein each of the first slit, the second slit, the third slit, and the fourth slit expose sidewalls of the bottom electrode.

12. The semiconductor memory device according to claim 11, wherein the fourth slit intersects with at least one of the first slit, the second slit, and the third slit to form a radial pattern.

13. The semiconductor memory device according to claim 11, wherein the first slit, the second slit, and the third slit are connected to form a radial pattern.

14. The semiconductor memory device according to claim 11, wherein one of the first slit, the second slit, and the third slit is extending along the row direction or the column direction.

15. The semiconductor memory device according to claim 14, wherein an angle between any two of the first slit, the second slit, and the third slit is larger than 90 degrees.

16. The semiconductor memory device according to claim 11, wherein a plurality of the first slits, a plurality of the second slits, and a plurality of the third slits are formed in the supporting layer and are connected to form a mesh pattern.

17. The semiconductor memory device according to claim 11, wherein the first slit, the second slit, the third slit, and the fourth slit respectively partially expose sidewalls of more than 10 of the bottom electrodes.

18. The semiconductor memory device according to claim 11, further comprising:
a capacitor dielectric layer covering along the bottom electrodes and the supporting layer; and
a top electrode covering on the capacitor dielectric layer.

* * * * *